United States Patent
Nagothu et al.

(10) Patent No.: US 12,027,612 B2
(45) Date of Patent: Jul. 2, 2024

(54) SCR HAVING SELECTIVE WELL CONTACTS

(71) Applicant: Texas Instruments Incorporated, Dallas, TX (US)

(72) Inventors: Karmel Kranthi Nagothu, Karnataka (IN); James Paul Di Sarro, Allen, TX (US); Rajkumar Sankaralingam, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 25 days.

(21) Appl. No.: 17/340,255

(22) Filed: Jun. 7, 2021

(65) Prior Publication Data
US 2022/0223723 A1 Jul. 14, 2022

Related U.S. Application Data

(60) Provisional application No. 63/177,111, filed on Apr. 20, 2021, provisional application No. 63/137,341, filed on Jan. 14, 2021.

(51) Int. Cl.
| | |
|---|---|
| H01L 29/08 | (2006.01) |
| H01L 27/02 | (2006.01) |
| H01L 29/74 | (2006.01) |

(52) U.S. Cl.
CPC .......... H01L 29/74 (2013.01); H01L 27/0262 (2013.01); H01L 29/0834 (2013.01); H01L 29/0839 (2013.01)

(58) Field of Classification Search
CPC . H01L 29/74; H01L 27/0262; H01L 29/0834; H01L 29/0839

USPC .......................................................... 257/154
See application file for complete search history.

(56) References Cited

U.S. PATENT DOCUMENTS

| | | | |
|---|---|---|---|
| 6,894,351 B2* | 5/2005 | Okawa | H01L 29/7436 257/E27.111 |
| 8,143,673 B1* | 3/2012 | Walker | H01L 29/7436 257/E29.012 |
| 10,685,954 B1 | 6/2020 | Shen et al. | |
| 2004/0089909 A1* | 5/2004 | Lee | H01L 27/0262 257/491 |
| 2007/0018193 A1* | 1/2007 | Ker | H01L 27/0262 257/119 |
| 2007/0138589 A1* | 6/2007 | Shiu | H01L 31/105 257/461 |
| 2007/0228475 A1* | 10/2007 | Burdeaux | H01L 27/0255 257/355 |
| 2007/0241407 A1* | 10/2007 | Kim | H01L 29/0619 257/E27.06 |
| 2008/0308837 A1* | 12/2008 | Gauthier, Jr. | H01L 27/0262 257/107 |
| 2009/0294855 A1* | 12/2009 | Lim | H01L 27/0259 257/355 |

(Continued)

*Primary Examiner* — Sheikh Maruf
(74) *Attorney, Agent, or Firm* — Andrew R. Ralston; Frank D. Cimino

(57) ABSTRACT

A lateral semiconductor controlled rectifier (SCR) includes a pwell and an nwell A plurality of p+ contact regions connect to the pwell and are spaced apart from one another by a dielectric material along a width of the pwell. There are a plurality of n+ contact regions connect to the nwell and are spaced apart from one another by dielectric material along a width of the nwell.

22 Claims, 11 Drawing Sheets

(56) References Cited

U.S. PATENT DOCUMENTS

| | | | |
|---|---|---|---|
| 2010/0214704 A1* | 8/2010 | Lamey | H01L 27/0255 |
| | | | 257/E21.536 |
| 2011/0013326 A1* | 1/2011 | Ker | H01L 27/0262 |
| | | | 257/140 |
| 2012/0161232 A1* | 6/2012 | Farbiz | H01L 27/0629 |
| | | | 257/337 |
| 2013/0264640 A1* | 10/2013 | Salman | H01L 29/41775 |
| | | | 257/E21.409 |
| 2013/0277745 A1* | 10/2013 | Tsai | H01L 27/0629 |
| | | | 257/355 |
| 2013/0285113 A1* | 10/2013 | Edwards | H01L 27/0262 |
| | | | 257/133 |
| 2013/0285114 A1* | 10/2013 | Boselli | H01L 27/0262 |
| | | | 257/E29.181 |
| 2014/0035039 A1* | 2/2014 | Tsai | H01L 27/0277 |
| | | | 257/362 |
| 2014/0084380 A1* | 3/2014 | Domanski | H01L 27/0623 |
| | | | 257/378 |
| 2015/0050784 A1* | 2/2015 | Di Sarro | H01L 29/7412 |
| | | | 438/134 |
| 2015/0236011 A1* | 8/2015 | Wang | H01L 29/87 |
| | | | 257/173 |
| 2017/0257088 A1* | 9/2017 | Wu | H03K 17/08 |
| 2018/0366460 A1* | 12/2018 | Boselli | H01L 27/0682 |
| 2020/0258981 A1* | 8/2020 | Guitard | H01L 27/0262 |
| 2020/0381417 A1* | 12/2020 | Salcedo | H01L 29/0834 |
| 2022/0328629 A1* | 10/2022 | Guitard | H01L 27/1027 |

* cited by examiner

SCR HAVING SELECTIVE WELL CONTACTS

CROSS REFERENCE TO RELATED APPLICATIONS

This Application claims the benefit of Provisional Application Ser. No. 63/137,341, entitled "Selective Well Tap Placement for Improving Current Uniformity in High-Voltage SCRs", filed on Jan. 14, 2021, which is herein incorporated by reference in its entirety.

FIELD

This Disclosure relates to integrated circuits (ICs) that include silicon controlled rectifiers (SCRs) that are also known as semiconductor controlled rectifiers.

BACKGROUND

Electrostatic discharge (ESD) takes place between two or more electrically conductive objects when at different electrostatic potentials. ESD causes high momentary current to flow in the body through which the discharge occurs. To protect against ESD, some ICs need ESD protection to be implemented on the IC substrate itself. One specific application example is for automotive applications, where in the case of automotive IC qualification SCRs can provide an on-chip International Electrotechnical Commission (IEC) compliant solution. IEC 61000-4-2 is a well-known immunity standard regarding system-level ESD.

An SCR is a lateral four-layer (a pnpn or npnp of structure) solid-state current-controlling device. SCRs include an anode and cathode along with an anode contact and a cathode contact, as well as a power supply (e.g., VDD) and a ground contact, and are thus unidirectional devices which can after triggering conduct in only one direction, that being from the p-type anode to the n-type cathode. There are three distinct modes of operation for an SCR depending upon the bias conditions applied.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an IC comprising a substrate having a semiconductor surface including circuitry comprising a plurality of transistors configured together for realizing at least one circuit function. A lateral SCR is in the semiconductor surface that includes a pwell and an nwell. The pwell includes a plurality of p+ pwell contact regions and a plurality of n+ nwell contact regions, where the n+ and p+ well contact regions are spaced apart along a width of the respective wells including at respective ends of the wells. An n+ region is positioned inside the pwell and a p+ region is positioned inside the nwell. First and second electrical connections generally comprising metal respectively that provide cathode and anode terminals to the SCR, the first connection being between the n+ region and the p+ pwell contact regions, and the second electrical connection being between the p+ region and the n+ nwell contact regions.

The anode terminal is connected to a first node in the circuitry, and the cathode terminal is connected to a second node in the circuitry. Besides being implemented on an IC, the SCR can also be a standalone SCR device.

BRIEF DESCRIPTION OF THE DRAWINGS

Reference will now be made to the accompanying drawings, which are not necessarily drawn to scale, wherein:

As shown in FIG. 5A a disclosed DENMOS-SCR with disclosed n+ and p+ well contact regions and 50% well contact coverage shows a deeper snapback behavior as compared to an otherwise equivalent SCR without disclosed well contact regions during an initial low-amplitude pulse. As shown in FIG. 5B the peak temperature reached during this double pulse stimulus was found to decrease relative to the otherwise equivalent SCR by approximately 50% (from 1200 K to 600 K).

DETAILED DESCRIPTION

Figure 1A:
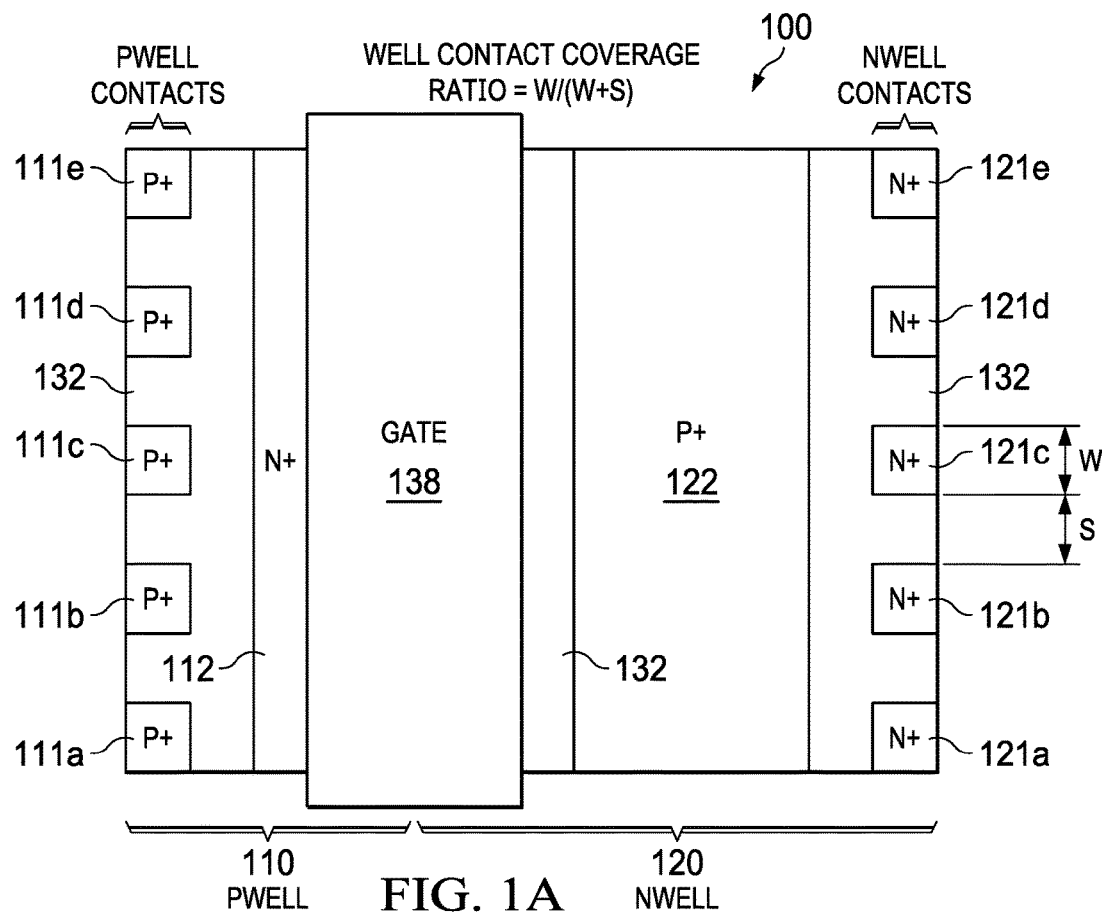
FIG. 1A is a top view of a disclosed drain extended n-channel metal oxide semiconductor (DENMOS-SCR), where the DENMOS-SCR includes a plurality of p+ pwell contact regions and a plurality of n+ nwell contact regions. W represents the width of each well contact region and S represents the spacing between each well contact region.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

SCRs are recognized to be sensitive to specific system-level ESD stress modes, such as IEC 61000-4-2, the International Electrotechnical Commission's immunity standard on ESD. Discharge through a common-mode choke needed by some applications, such as by automotive applications, can lead to unexpected IC failure levels. Known on-chip ESD solutions used as to improve IC robustness to IEC-through-choke stress result in reducing RF noise immunity and cause RF direct power injection (DPI) noise immunity test failures. Accordingly, for a conventional SCR there is an inherent trade-off between system-level ESD performance and DPI.

Disclosed SCRs are realized by including a plurality of spaced apart n+ nwell and p+ pwell contact regions, optionally at uniform intervals, positioned along a width of the pwell and the width of the nwell. Disclosed SCRs improve the current flow uniformity at generally any current level, including at low-current densities unlike conventional SCRs. The respective wells are generally shaped as rectangular solids that they have a length and a width. Disclosed well contacts include well contacts that are also present at the ends of the respective wells to discourage triggering near the ends of the wells.

The p+ pwell contact regions and n+ nwell contact regions in one arrangement are positioned at uniform intervals along the width of the respective wells, where the respective wells may each be shaped as a rectangular solid. In some examples a disclosed well contact region is present at the distal ends of each of the pwell and the nwell. In a conventional SCR arrangement, there is typically a single n+ nwell contact spanning the entire width of the nwell, and a single p+ pwell contact spanning the entire width of the pwell.

FIG. 1A is a top view of a disclosed DENMOS-SCR 100, where the DENMOS-SCR 100 includes a pwell 110 having a plurality of p+ pwell contact regions 111a-e, an nwell 120, also referred to herein as being the drain drift region, having a plurality of n+ nwell contact regions 121a-e. Although five well contact regions are shown for each well, the number of well contact regions can be more than five or less than five, and is not necessarily same number for each well. W represents the width of each well contact region and S represents the spacing between each well contact region. DENMOS-SCR 100 also includes dielectric isolation 132, shown in FIG. 1B as shallow trench isolation (STI), and a gate 138. Besides STI the dielectric isolation 132 can comprise local oxidation of silicon (LOCOS) or other dielectric isolation technique. There is also an n+ region 112 in the pwell 110 and a p+ region 122 in the nwell 120. The structure for disclosed SCRs can be either npnp, or pnpn as shown in FIG. 1A.

Figure 1B:
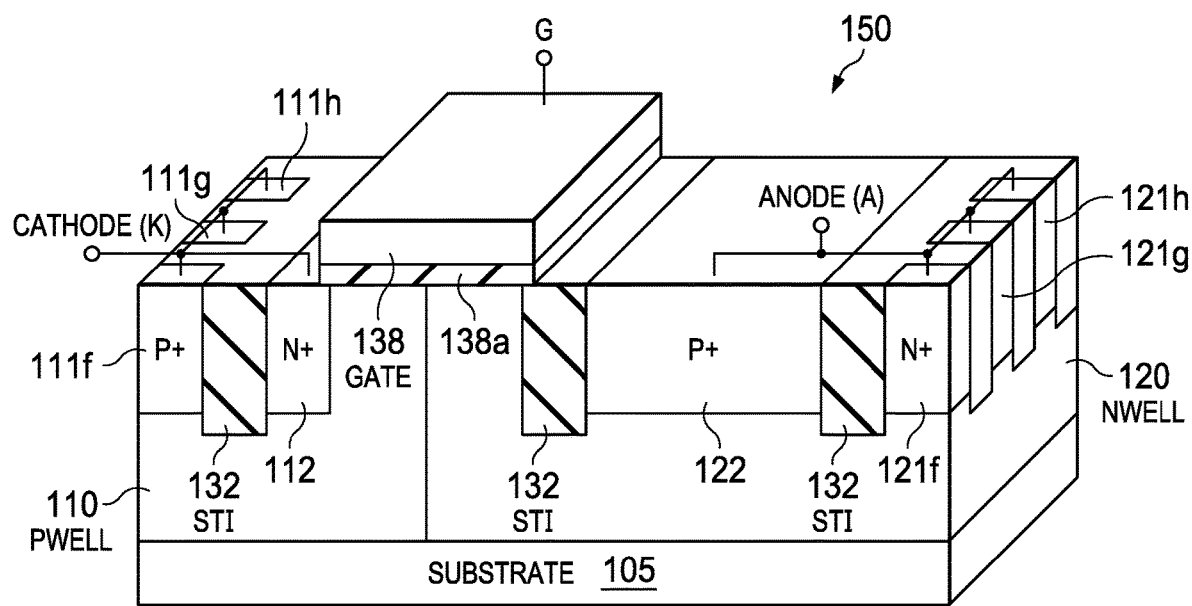
FIG. 1B is a modified cross-sectional view of a disclosed DENMOS-SCR that is similar to the DEMOS-SCR shown in FIG. 1A, where the SCR is shown including a plurality of p+ pwell contact regions and a plurality of n+ nwell contact regions that are enabled to be shown by the addition of a dimension configured to show a plurality of well contact regions.

FIG. 1B is a cross-sectional view of a disclosed DENMOS-SCR 150 that is based on the DEMOS-SCR 100 shown in FIG. 1A, where the DENMOS-SCR is shown including a plurality of p+ pwell contact regions shown as 111f, 111g, and 111h, and a plurality of n+ nwell contact regions shown as 121f, 121g, and 121h, both enabled to be visible by an added dimension configured to show the respective plurality of well contact regions.

The substrate is shown as 105. The dielectric isolation as noted above is shown as STI 132. A gate dielectric layer 138a is shown under the gate 138. The gate 138 can comprise polysilicon, or a metal. There is also shown schematically one of the metallization layers of an interconnection system (typically the top metal layer) which can connect the n+ region 112 and the p+ pwell contact regions 111f, 111g, and 111h to provide a cathode terminal (abbreviated "K"), and connect the p+ region 122 and the n+ pwell contact regions 121f, 121g, and 121h to provide an anode terminal (abbreviated "A"). A connection to the gate 138 provides a gate terminal (abbreviated "G").

What is termed herein a well contact coverage ratio (WCCR) is defined herein by the equation W/(W+S)) which is a design parameter that can be used to design and simulate a disclosed SCR. W is the width of the contact regions taken in a direction from one well contact to a nearest neighbor well contact, that may be uniform in extent, and S is the spacing between the nearest neighbor contact regions. Typical WCCRs can be 25% to 75%. As S increases, the WCCR decreases. The WCCR determines the effective width of the reverse strike pwell/nwell diode integrated into a MOS-SCR, e.g. the DENMOS-SCR 100, or a junction SCR, for example the junction SCR 300 shown in FIGS. 3A/3B and described below.

The WCCR represents an SCR design trade-off. Relatively small values of the WCCR can be beneficial for maximizing the triggering uniformity of the SCR from anode to cathode at low current densities for positive polarity ESD zaps. However, for negative polarity zaps, the ESD protection path is through the integrated nwell/pwell diode inside the SCR. The nwell and pwell contacts form the terminals for this diode and reducing the WCCR decreases the effective width of the diode and its ESD protection level. If the ESD protection level of the integrated diode is insufficient, a separate ESD diode may be added in parallel to provide negative protection, increasing total ESD clamp area. As the WCCR of the SCR decreases, the size of the parallel diode may be increased to compensate. The best WCCR value for a given design generally corresponds to the largest value that provides an adequately low ESD failure level in the forward conduction mode during challenging system-level ESD events, such as an IEC discharge through a common-mode choke.

Reduced total well contact region area coverage provided by disclosed noncontiguous well contacts increases the effective well resistance seen by the SCR as compared to conventional SCR that as described above has single large area well contacts. The increased effective well resistance is understood to result in a stronger, more uniform triggering, including at low current densities. Well contacts may be placed in regions expected to be prone to current filamentation. Such areas include the distal ends of the respective wells. For example, p+ well contacts 111a and 111e shown in FIG. 1A are located at distal ends of the pwell 110. Placement of the well contacts in this manner is understood to reduce the local well resistance and direct the current upon triggering away from these distal end regions once the SCR has begun to trigger.

The SCR 100 may be operated as a two-terminal or a three-terminal device. As a two-terminal device, the gate 138 may be tied to the cathode, e.g. the n+ region 112 and p+ well contacts, either directly (negligible resistance) connection, or through a small resistance. In this configuration the cathode may be grounded, and the anode connected to a protected node. In a three-terminal device, a potential on the gate 138 may be determined independently of the cathode. In this configuration, a control circuit may be determined the gate 138 potential, the cathode may be grounded, and the anode may be connected to a protected node. Those skilled in the art will understand that other operational configurations may determined in other operating contexts.

As described above disclosed SCRs can be implemented for both MOS-SCRs and junction SCRs. Unlike MOS SCR's junction SCRs do not have a gate, and thus cannot form an inversion layer in a channel prior to SCR triggering. Unlike MOS-SCRs, junction SCRs thus cannot rely upon formation of an inversion layer in the channel to improve triggering uniformity. Junction SCRs are discussed further below in the context of FIGS. 3A and 3B.

A method 200 described below can be adapted to a process that forms on the IC one or more DENMOS-SCRs. However, disclosed selective well contacts can also be applied to DEPMOS-SCRs, junction SCRs, and laterally-diffused metal-oxide semiconductor (LDMOS)-SCRs, which are structurally very similar to DENMOS-SCRs. Moreover, as noted above, the SCR may be implemented alone on the die for the case of discrete ESD protection devices, such as when intended for printed circuit board (PCB)-level ESD protection.

The disclosed method for forming the p+ contact regions and n+ contact regions, that can both utilize conventional photolithography, generally comprises an ion implantation step that may occur when performing source/drain implants for DENMOS devices formed elsewhere on the same device substrate. Both DEPMOS and DENMOS may be both provided on the same IC, which generally can utilize the same process steps. Thus, adding a disclosed DENMOS-SCR to an IC can be a zero-mask adder design relative to the DENMOS fabrication steps as the steps needed to make each of these devices, and the process steps can be identical and thus formed simultaneously.

FIGS. 2A-2G show a series of cross-sectional views that illustrate in-process results for an example of the method 200 of forming a DENMOS-SCR. As used herein, a DENMOS-SCR or DEPMOS-SCR includes a drain-extended MOS device, which comprises an asymmetric high-voltage MOS device that generally has a drain structure including a drain drift region which enables supporting a high voltage applied between the drain and the gate or source.

Figure 2A:
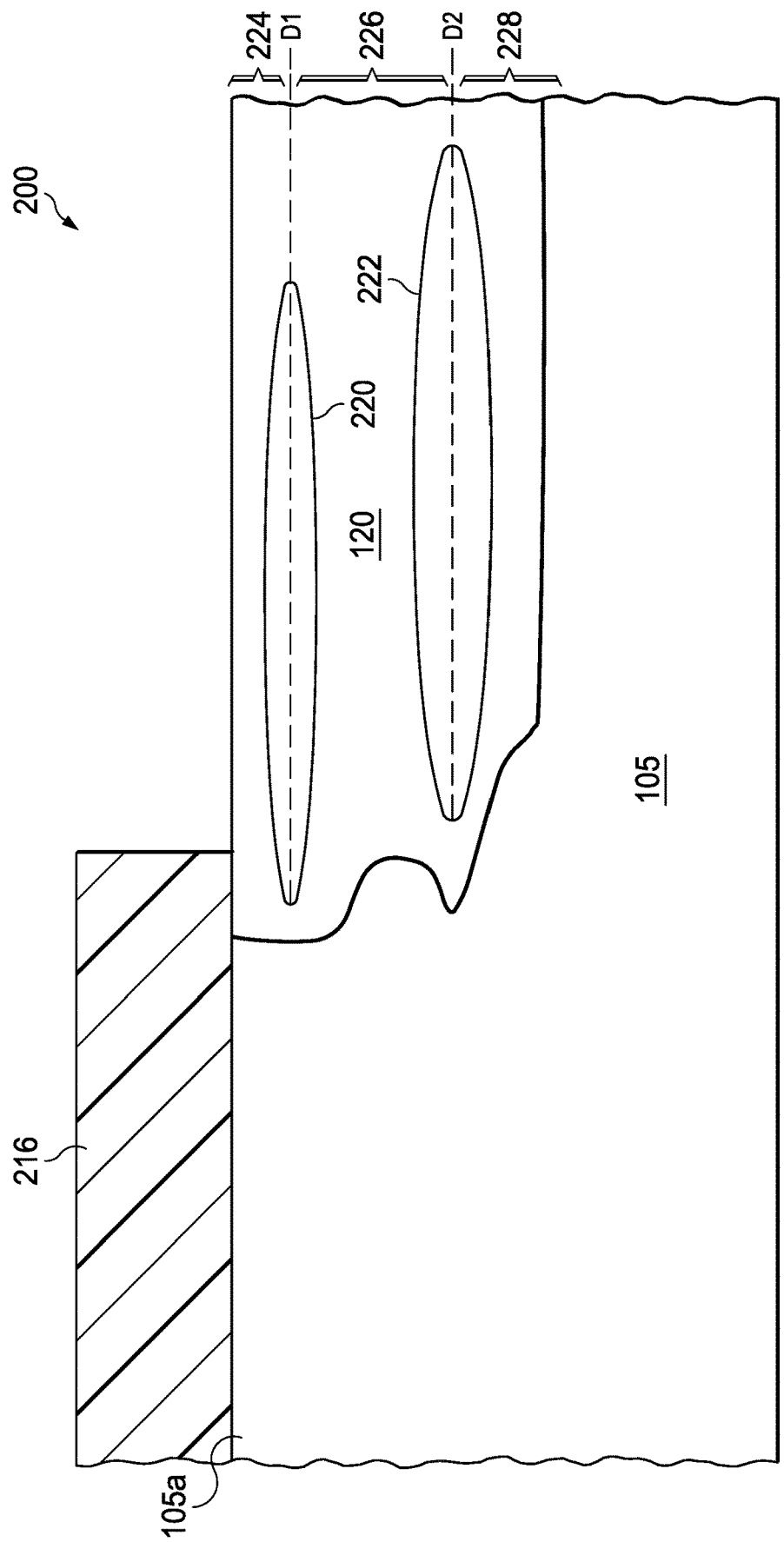
FIGS. 2A-2G show a series of cross-sectional views that illustrate in-process results for an example of a method of forming a DENMOS-SCR based on the DEMOS-SCR shown in FIG. 1B.

Method 200 begins by obtaining a semiconductor material shown as substrate 105 that may be or include an epitaxial layer on a semiconductor wafer. FIG. 2A shows the substrate 105 after forming a drain drift region shown as nwell 120 within the substrate 105, where the nwell 120 has a first conductivity type and can optionally have two horizontal dopant concentration peaks comprising a first peak at a depth D1 measured from a top surface 105a of the substrate 105, and a second peak at a depth D2 from the top surface 105a of the substrate 105. In this example, the nwell 120 has an n conductivity type.

The nwell 120 can be formed by first forming a patterned photoresist layer shown as 216 on the substrate 105. The patterned photoresist layer 216 may be formed in a conventional manner, which includes depositing a layer of photoresist, projecting a light through a patterned chrome layer on a glass plate, known as a mask, and developing the photoresist to form a patterned image on the layer of photoresist 216.

After the patterned photoresist layer 216 has been formed, dopants are implanted into the substrate 105 through openings in the patterned photoresist layer 216, in this example to form an upper region 220 that is part of the drain drift region 120. In examples in which the method 200 is used in the context of a DENMOS device process flow, upper region 220 is a more highly doped shallow portion of the nwell 120. Upper region 220 has a horizontal dopant concentration peak at the depth D1. In this example, arsenic is implanted such that the upper region 220 is n-type. The arsenic dopants can be implanted with, for example, a dose in a range between $4 \times 10^{12}$ and $8 \times 10^{12}$ cm$^{-2}$ and an energy in a range between 200 keV and 350 keV.

With the patterned photoresist layer 216 still in place, dopants are again implanted into the substrate 105 through the patterned photoresist layer 216, this time to form a lower region 222 which like upper region 220 is part of the nwell 120. Upper regions 220 and 222 are higher doped n-type regions that may be present in the nwell 120 of a DENMOS device to improve performance metrics, such as the breakdown voltage and on-state resistance. These multiple implant steps are used to form nwell 120 with a profile that improves the performance of such DENMOS devices. The lower region 222 has a horizontal dopant concentration peak at the depth D2. In this example, phosphorous is implanted such that the lower region 222 is n-type. The phosphorous dopants can be implanted with, for example, a dose in a range between $8 \times 10^{12}$ and $2 \times 10^{13}$ cm$^{-2}$ and an energy in a range between 100 keV and 400 keV. The upper region 220 may be formed before the lower region 220, or vice versa. Further, in some examples the upper region 220 and the lower region 222 may be omitted, such as when the SCR is formed without the presence of DEMOS devices on the substrate 105.

After the lower region 222 has been formed, the patterned photoresist layer 216 is removed in a conventional manner, such as with an ashing process. Following this, a thermal drive process diffuses and activates the dopants to complete the formation of nwell 120. The thermal drive process can include a heat treatment of 1100° C. for 90 minutes or equivalent conditions, for example, 1125° C. for 50 minutes, or 1050° C. for 138 minutes.

The depth D1 defines a drift top section 224 is also part of the nwell 120. The drift top section 224 extends from the top surface 105a of semiconductor material 105 down to the depth D1, and comprises more lightly doped semiconductor than the upper region 220. Portions of drift top section 224 are doped during the thermal drive process, which causes dopants from upper region 220 to out-diffuse up into drift top section 224.

Drift top section 224 has a dopant concentration profile in which the dopant concentration increases with increasing depth (retrograde). In the present example, drift top section 224 continuously increases from a lower dopant concentration at the top surface 105a of semiconductor material 105 to a higher dopant concentration at the depth D1. Further, the largest dopant concentration within drift top section 224 is at the depth D1.

The depth D1 and the depth D2 define a drift middle section 226 that is the middle portion of the nwell 120 that extends from the depth D1 down to the depth D2. Portions of drift middle section 226 are also doped during the thermal drive process, which causes dopants from upper region 220 to out-diffuse down, and portions of lower region 222 to out-diffuse up into drift middle section 226.

Drift middle section 226 has a dopant concentration profile in which the dopant concentration first decreases with increasing depth from D1, and then increases with increasing depth to D2. In this example, drift middle section 226 continuously decreases from a higher dopant concentration at depth D1 to a lower dopant concentration at a point between the depths D1 and D2, and then continuously increases to a higher dopant concentration at depth D2. Further, the two largest dopant concentrations within drift middle section 226 are at the depths D1 and D2. The dopant concentration at D1 and at D2 may be the same or different from each other.

The depth D2 also defines a drift bottom section 228 that is a bottom portion of the nwell 120 that extends down a distance from the depth D2. Drift bottom section 228 is also doped during the thermal drive process, which causes dopants from lower region 222 to out-diffuse down into bottom section 228.

Drift bottom section 228 has a dopant concentration profile in which the dopant concentration decreases with increasing depth from depth D2. In this example, drift bottom section 228 continuously decreases from a high dopant concentration at depth D2 to a lower dopant concentration. Further, the largest dopant concentration within drift bottom section 228 is at the depth D2.

Figure 2B:
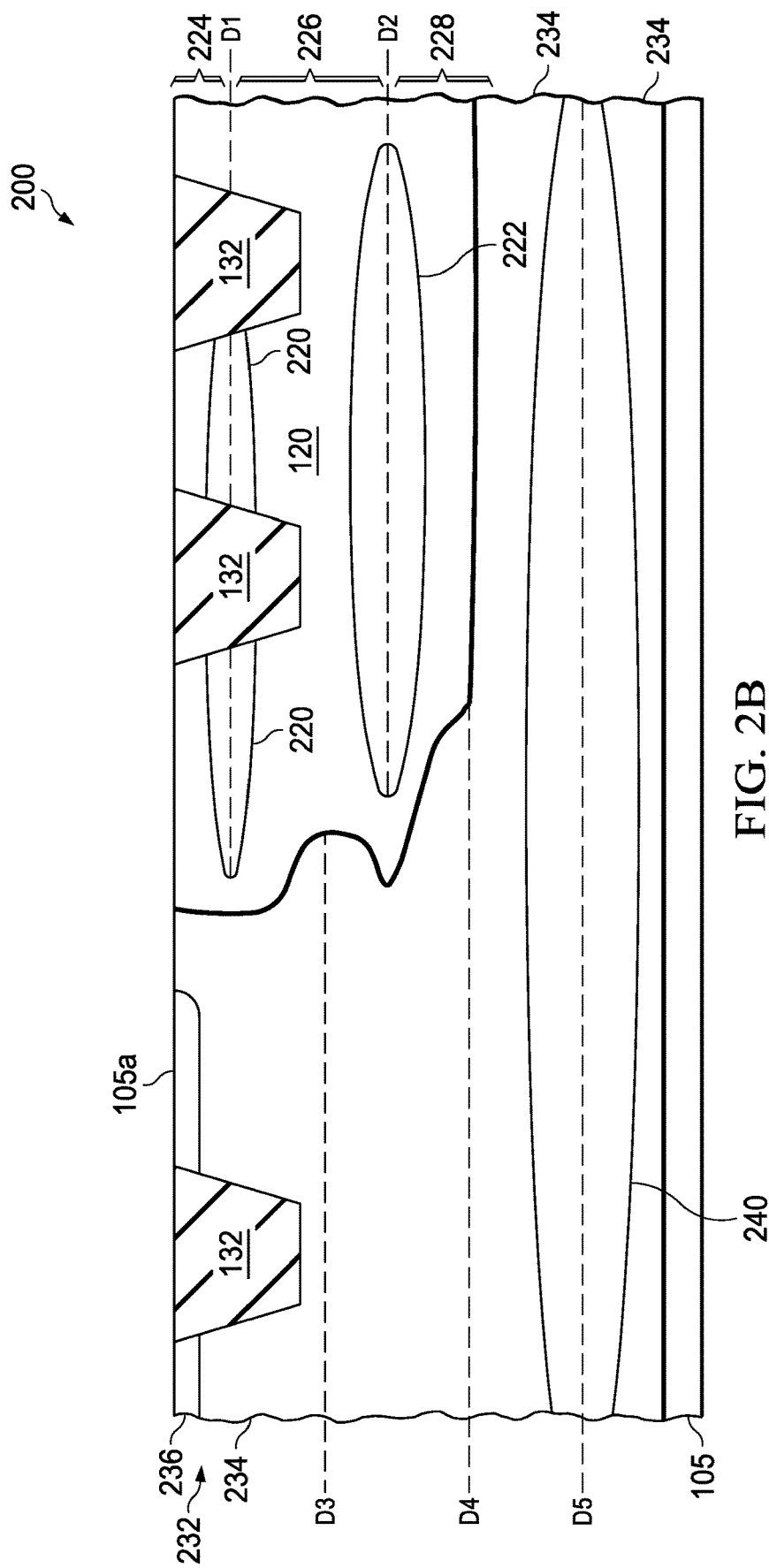

As shown in FIG. 2B, after the nwell 120 has been formed, dielectric isolation regions, e.g. the STI regions 132, are formed. including two instances of the STI regions 132 in the nwell 120. The STI regions 132 can be formed in a conventional manner. For example, a hard mask can be formed over the substrate 105. After the hard mask has been formed, the substrate 105 is etched through the hard mask to form a number of trenches in the substrate 105. Next, the hard mask is removed, and a non-conductive (dielectric) material is deposited on the top surface of the substrate 105 to fill up the trenches. The non-conductive material on the top surface of substrate 105 is then removed, such as with a chemical-mechanical planarization (CMP) process, to leave the STI regions 132 in the trenches. As noted above, besides STI, the dielectric isolation can comprise LOCOS (silicon oxide), or a silicide block material such as silicon nitride on the top surface 105a of the substrate 105.

As further shown in FIG. 2B, after the STI regions 132 have been formed, a doped region 232 is next formed within the substrate 105. The doped region 232 has a back gate region 234 of a second conductivity type, such a p-type, and a surface region 236 of the first conductivity type that touches back gate region 234.

The back gate region 234 corresponds to the pwell 110 shown in FIGS. 1A and 1B that is generally formed to have a step shape that corresponds with three dopant concentration peaks comprising a peak at a depth D3 down from the top surface of semiconductor material 105, a peak at a lower depth D4, and a peak at a yet lower depth D5. In this example, the back gate region 234 has a p conductivity type, and the surface region 236 that is encompassed in the n+ region 112, but is significantly shallower and has a lower dopant concentration as compared to the n+ region 112 shown in FIG. 1B. Region 280, which is the DENMOS n+ source, first appears in FIG. 2F described below because it is not formed until later in the process. N+ region 112 in FIG. 1B corresponds directly to the combination of n+ region 280, first shown in FIG. 2F, and the surface region 236.

Back gate region 234 can be formed by first blanket implanting dopants into the substrate 105 to form a buried region 240 lies below the bottom section 228 of drain drift region which as described above corresponds to the nwell 120 shown in FIG. 1B. Buried region 240 is a p-type region that is located at the bottom of the pwell 110 and below the nwell 120. This is an optional implant which is not needed for a disclosed DENMOS-SCR or a DENMOS-SCR, but may be formed coincident with forming DEMOS devices elsewhere over the substrate 105. Further, the implant that forms the buried region 240 may be a blanket implant, such that no photoresist is used to define the extent of the buried region 240 within the DENMOS-SCR 100. Buried region 240 has a dopant concentration peak at the depth D5. In the present example, boron is implanted such that the buried region 240 is p-type. The boron dopants can be implanted with, for example, a dose in a range between $1\times10^{12}$ and $9\times10^{13}$ cm$^{-2}$ and an energy in a range between 400 keV and 900 keV.

Figure 2C:
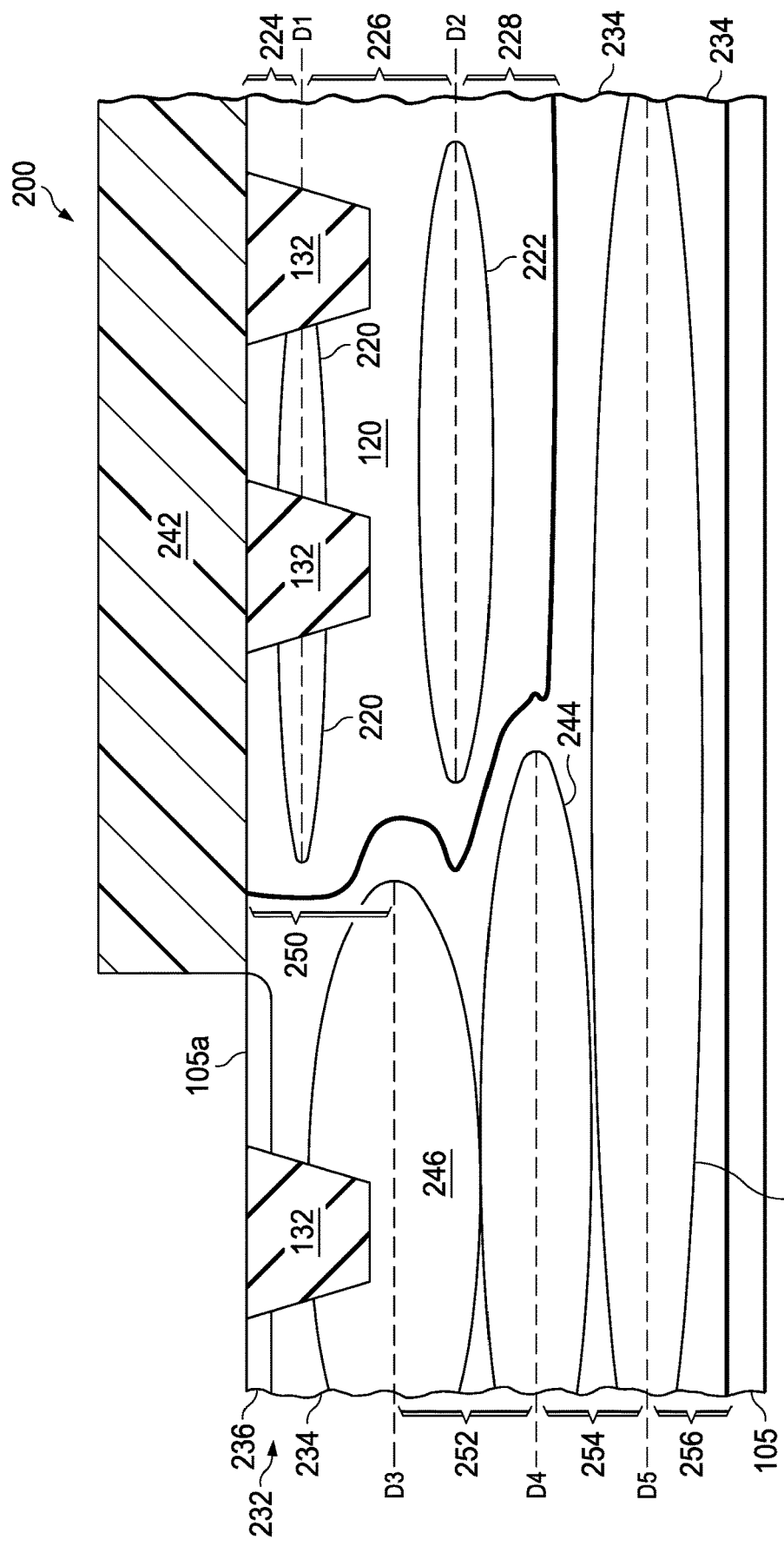

As shown in FIG. 2C, after the buried region 240 has been formed, a patterned photoresist layer 242 may be conventionally formed on the substrate 105. After the patterned photoresist layer 242 has been formed, dopants are angle-implanted into the substrate 105 through patterned photoresist layer 242 to form an intermediate region 244, which is near the middle of the pwell 110. Intermediate region 244 has a dopant concentration peak at the depth D4. In the present example, boron is implanted to form intermediate region 244. The boron can be implanted with, for example, a dose in a range between $2\times10^{13}$ and $4\times10^{13}$ cm$^{-2}$ and an energy in a range between 500 keV and 600 keV. With patterned photoresist layer 242 still in place, dopants are again implanted into semiconductor material 105 through patterned photoresist layer 242 to form a body region 246, which is the mid-to-upper region of the pwell 110. Body region 246 has a dopant concentration peak at the depth D3. In the present example, boron is implanted to form body region 246. The boron can be implanted with, for example, a dose in a range between $5\times10^{13}$ and $3\times10^{14}$ cm$^{-2}$ and an energy in a range between 70 keV and 500 keV.

After the body region 246 has been formed, dopants are yet again implanted into semiconductor material 105 through patterned photoresist layer 242 to reduce the size of back gate region 234 and to form a surface region 236 that is not directly represented in FIG. 1B. Surface region 236 touches the top surface 105a of the substrate 105 and lies above body region 246. In this example, arsenic is implanted to form surface region 236. The arsenic dopants can be implanted with, for example, a dose between $5\times10^{13}$ and $1\times10^{15}$ cm$^{-2}$ and an energy between 30 keV and 160 keV. The formation of the surface region 236 can optionally be omitted.

After the implant, patterned photoresist layer 242 may be removed in a conventional fashion. Following this, a thermal drive process is performed to diffuse and activate the dopants, and complete the formation of doped region 232, back gate region 234, and surface region 236. In this example, surface region 236 and the immediately surrounding area have an n-type conductivity following the thermal drive, while back gate region 234 has a p-type conductivity following the thermal drive. The order in which the nwell 120 and doped region 232 are formed can alternately be reversed.

The depth D3 defines a substrate top section 250 that extends from the top surface 105a of the substrate 105 down to the depth D3. Substrate top section 250 has a dopant concentration profile below and adjacent to surface region 236 where the dopant concentration increases with increasing depth. In the present example, substrate top section 250 continuously increases from a lower dopant concentration below and adjacent to surface region 236 to a higher dopant concentration at the depth D3. Further, the largest dopant concentration within the substrate top section 250 is at the depth D3.

The depth D3 and the depth D4 together define a substrate middle section 252 that extends from the depth D3 down to the depth D4. Substrate middle section 252 has a dopant concentration profile where the dopant concentration first decreases with increasing depth, and then increases with increasing depth.

In this example, the substrate middle section 252 continuously decreases from a higher dopant concentration at depth D3 to a lower dopant concentration at a point between the depths D3 and D4, and then continuously increases to a higher dopant concentration at depth D4. Further, the two largest dopant concentrations within substrate middle section 252 are at the depths D3 and D4.

The depth D4 and the depth D5 define a substrate middle section 254 that extends from the depth D4 down to the depth D5. Substrate middle section 254 has a dopant concentration profile where the dopant concentration first decreases with increasing depth, and then increases with increasing depth.

In this example, the substrate middle section 254 continuously decreases from a higher dopant concentration at depth D4 to a lower dopant concentration at a point between the depths D4 and D5, and then continuously increases to a higher dopant concentration at depth D5. Further, the two largest dopant concentrations within substrate middle section 254 are at the depths D4 and D5.

The depth D5 also defines a substrate bottom section 256 that extends down a distance from the depth D5. Substrate bottom section 256 has a dopant concentration profile where the dopant concentration decreases with increasing depth from depth D5. In this example, substrate bottom section 256 decreases from a higher dopant concentration at depth D5 to a lower dopant concentration. As illustrated, the depth D3 lies between the depth D1 and the depth D2. In addition, the depth D4 lies below the depth D2. Further, a portion of back gate region 234 of the second (p) conductivity type lies directly below the nwell 120.

Figure 2D:
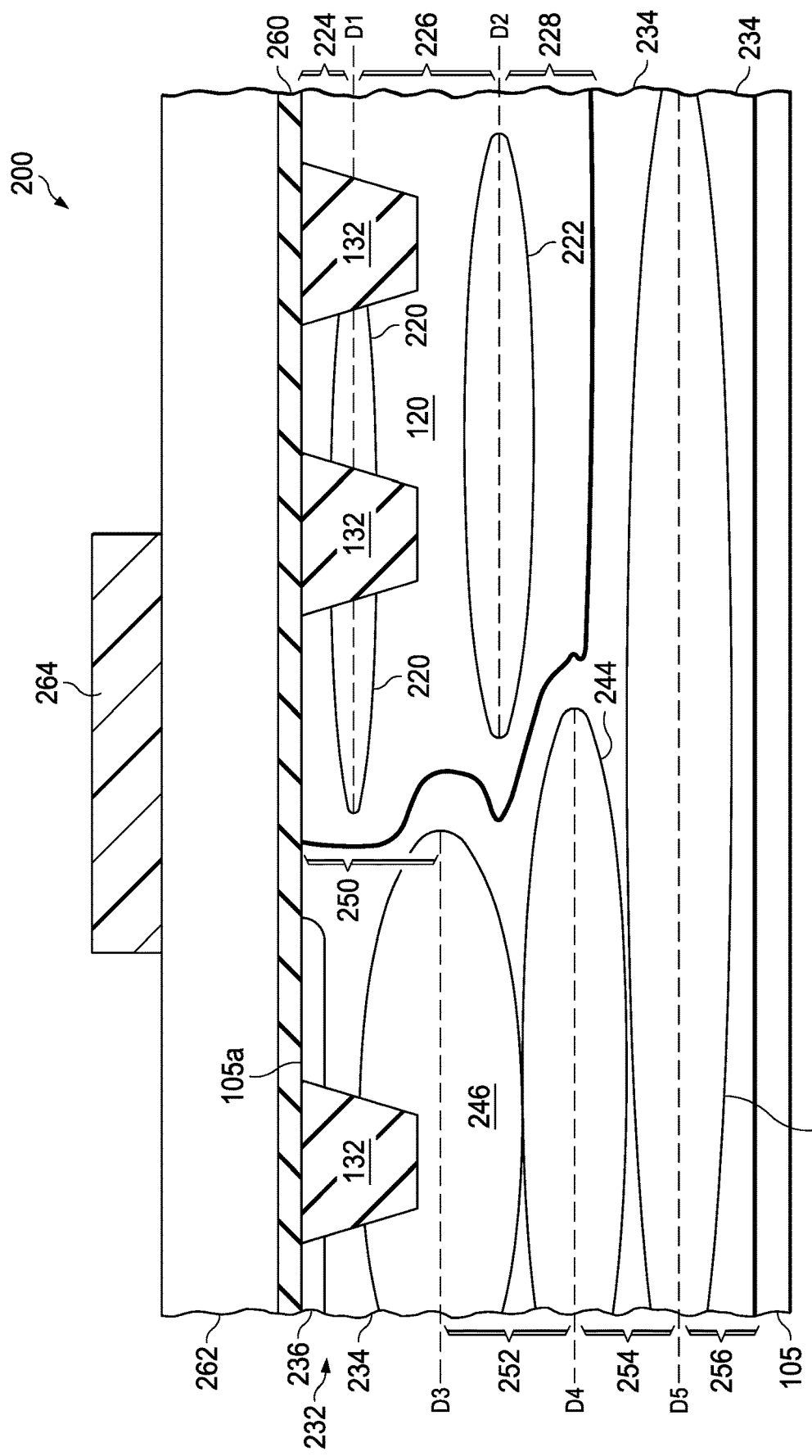

As shown in FIG. 2D, once the doped region 232 has been formed, method 200 next forms a gate dielectric layer 260 on the top surface 105a of the substrate 105. A cleanup etch of, for example, a wet etch using dilute hydrofluoric acid, can be performed prior to forming gate dielectric layer 260 to remove any unwanted oxide on the top surface 105a of the substrate 105.

Gate dielectric layer 260 can be implemented with a thermally grown silicon dioxide, and have a thickness that varies according to the voltages to be used. For example, gate dielectric layer 260 can comprise 12 to 15 nm of thermally grown silicon dioxide to support 5V gate operation. Gate dielectric layer 260 can include additional layers of other dielectric material, such as silicon oxynitride or hafnium oxide.

Following this, a layer of gate material 262 is deposited on the gate dielectric layer 260. The layer of gate material 262 can include 100 to 200 nm of polysilicon and possibly a layer of metal silicide on the polysilicon, such as 100 to 200 nm of tungsten silicide. Other materials which can be used to implement the layer of gate material 262 are within the scope of the instant example. Next, a patterned photoresist layer 264 may be conventionally formed over the layer of gate material 262.

Figure 2E:
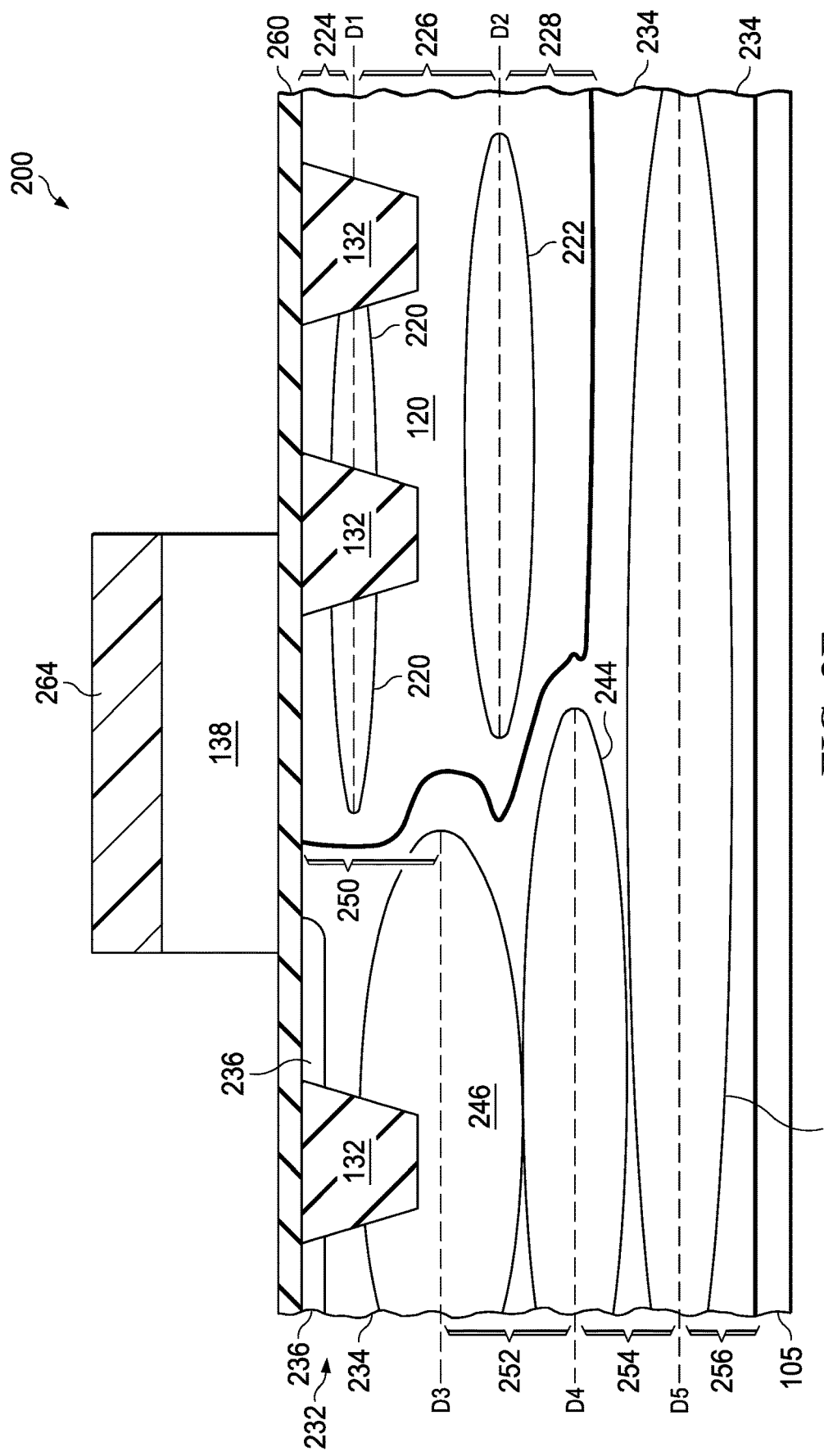

As shown in FIG. 2E, after patterned photoresist layer 264 has been formed, the exposed regions of the layer of gate material 262 may be etched in a conventional manner to expose gate dielectric layer 260 and form a gate 138. Following the etch, patterned photoresist layer 264 may be removed in a conventional fashion.

Figure 2F:
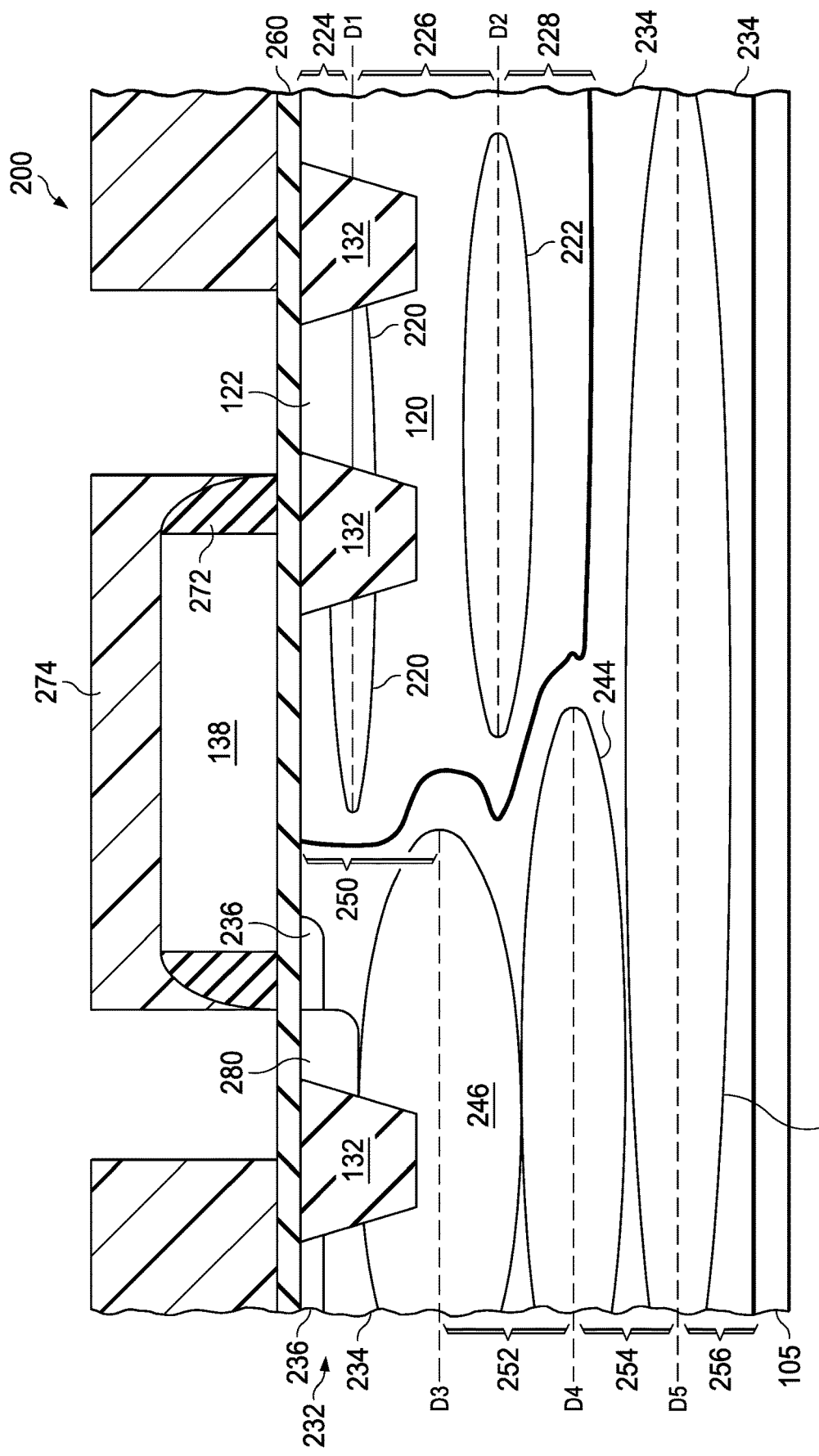

As shown in FIG. 2F, after patterned photoresist layer 264 has been removed, gate sidewall spacers 272 may be conventionally formed on the lateral surfaces of the gate 138. The gate sidewall spacers 272 can be formed by forming a conformal layer of silicon dioxide 50 to 150 nm thick over the top surface of the semiconductor device, and then removing the silicon dioxide from horizontal surfaces using an anisotropic etch process, such as a reactive ion etch (ME) process.

As further shown in FIG. 2F, a patterned photoresist layer 274 is next formed, e.g. conventionally, on gate dielectric layer 260 and gate 138. The gate dielectric layer 260 and gate 138 are included in the case of a disclosed DENMOS-SCR, but not included in the case of a disclosed junction SCR. After this, dopants having the same conductivity type as drain drift region 120 are implanted through patterned photoresist layer 274 to form the n+ region 280 and also an nwell contact 121f; where each of these regions have the same polarity as the drain drift region 120, e.g. n+. The n+ region 280 reduces the size of back gate region 234 and the surface region 236. As noted above, the n+ region 112 shown in FIG. 1B represents the combination of the n+ region 280 and the n-type surface region 236.

Figure 2G:
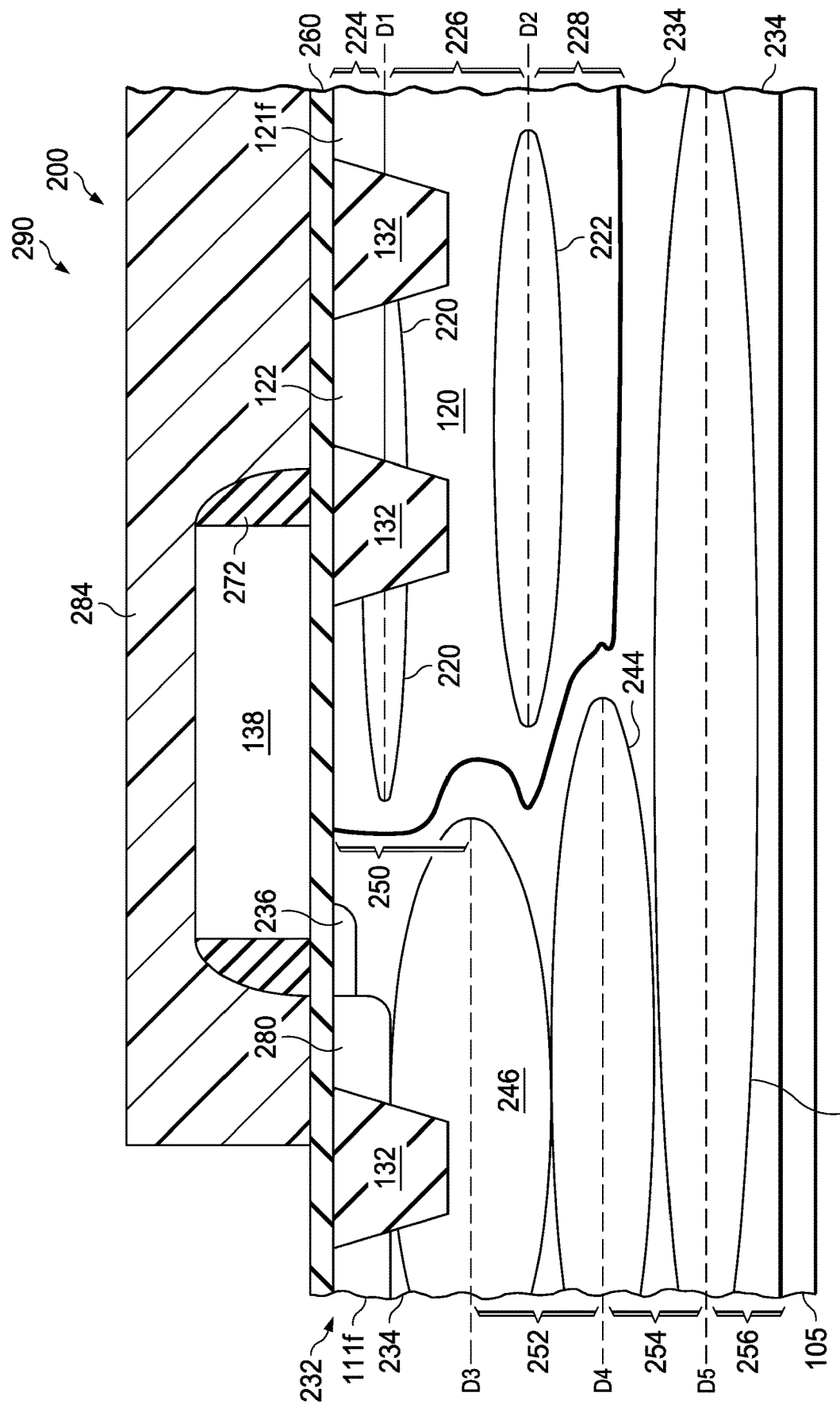

As shown in FIG. 2G, after patterned photoresist layer 274 has been removed, a patterned photoresist layer 284 is next formed, e.g. conventionally, on gate dielectric layer 260 and gate 138. After this, dopants having the same conductivity type as back gate region 234 are implanted through patterned photoresist layer 284 to form the p+ region 122 and a p+ body contact region 111f.

In this example, the p+ region 122 and the p+ body contact region 111f can be implanted with boron, using a dose in a range between $8\times10^{14}$ and $1\times10^{16}$ and an energy between 20 keV and 70 keV. Following the implant, patterned photoresist layer 284 is removed in a conventional manner to complete the formation of a DENMOS-SCR structure.

Although not shown for method 200, subsequent processing steps include formation of what can be termed a pre-metal dielectric (PMD) layer upon which contacts are formed to reach the contacts in the semiconductor surface of the IC, followed by at least they first layer metallization. In implementations that include multiple layers of metallization, there is at least a first ILD layer on the first layer metallization, where the first ILD layer includes vias, with at least a second layer metallization on the ILD layer. One of the metallization layers (typically the top metal layer) can provide the cathode and anode connections shown in FIG. 1B described above.

Figure 3A:
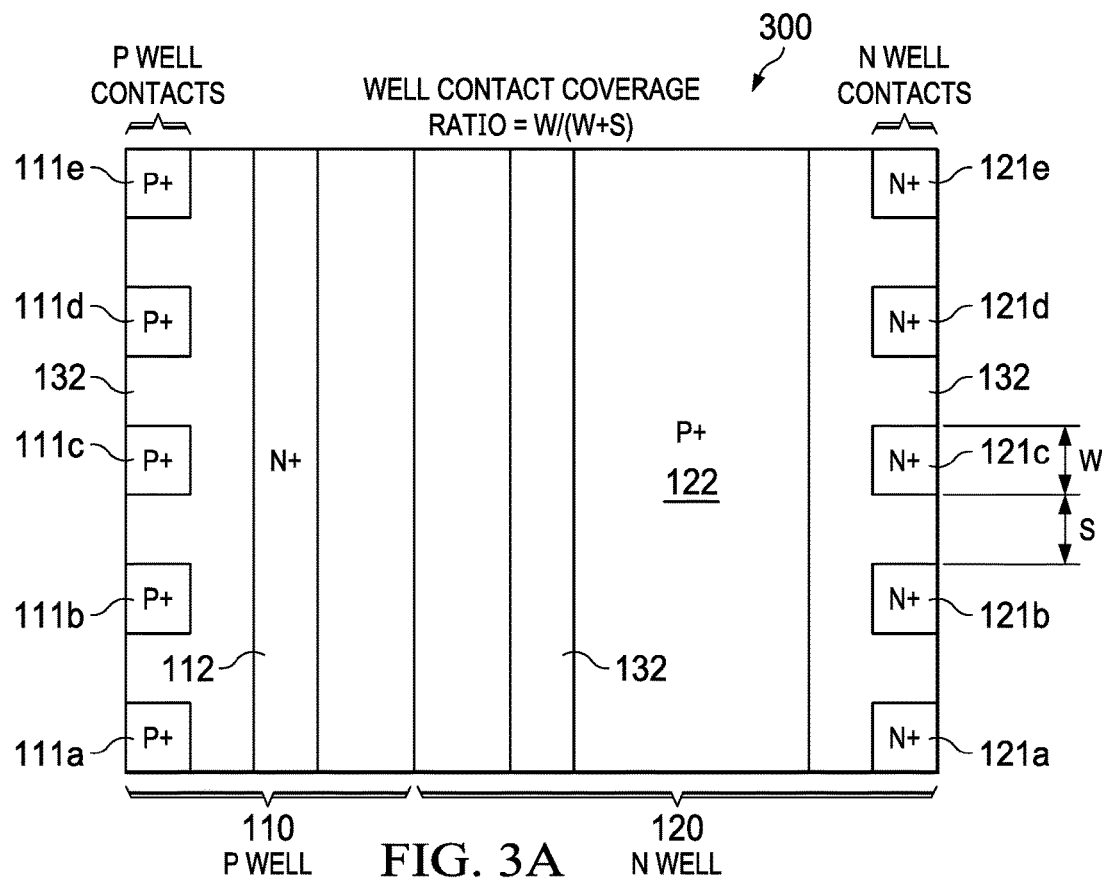
FIG. 3A is a top view depiction of a junction SCR, according to an example aspect. The junction SCR may be similar to the DENMOS-SCR shown in FIG. 1A, but without the gate.
Figure 3B:
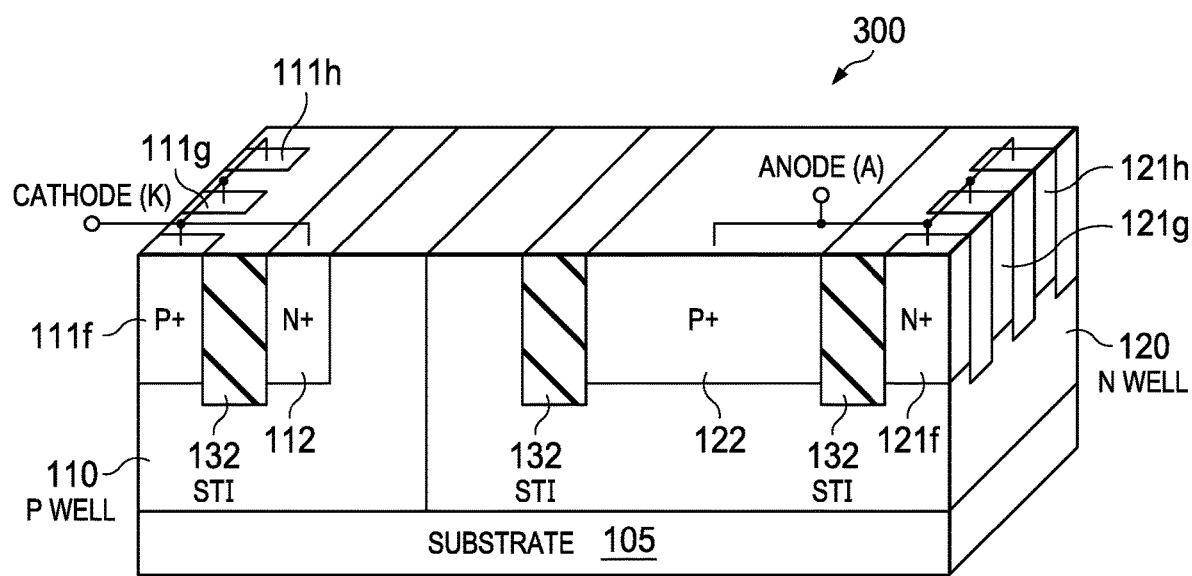
FIG. 3B is a cross-sectional view of the junction SCR shown in FIG. 3A.

FIG. 3A is a top view depiction of a junction SCR 300, according to an example aspect. The SCR 300 may be structurally similar to the DENMOS-SCR 100 shown in FIG. 1A but without the gate 138. FIG. 3B is a cross-sectional view of the junction SCR 300 shown in FIG. 3A. The SCR 300 may be operated as a two-terminal device. The cathode, e.g. the n+ region 112 and p+ well contacts, 111a-111e may be grounded, and the anode e.g., p+ region 122 and n+ well contacts 121a-121e may be connected to a protected node.

Figure 4:
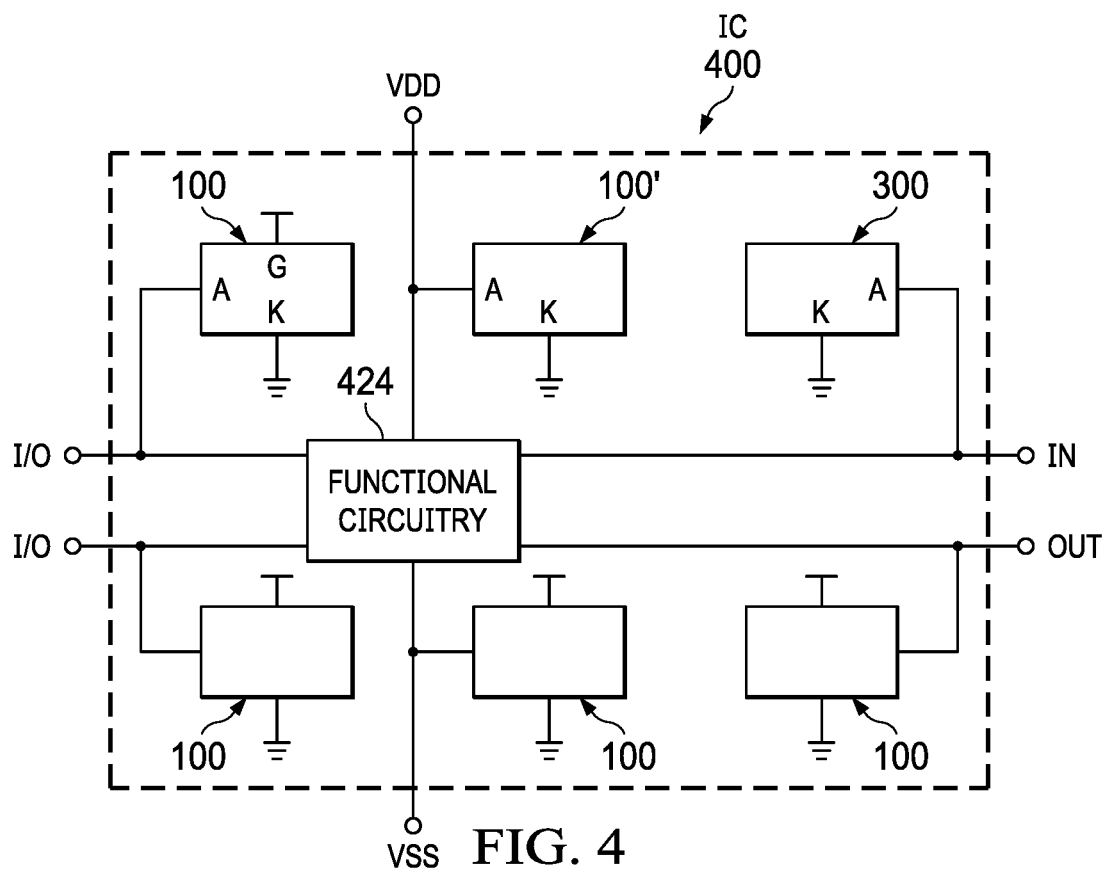
FIG. 4 is a schematic view that provides a high-level depiction of an IC comprising circuitry for implementing a function, where the IC includes a disclosed SCR.

FIG. 4 is a schematic view that provides a high-level depiction of an IC 400 comprising circuitry for implementing a function that includes a plurality of disclosed SCRs each shown as DENMOS-SCR 100 connected to protect various nodes in the circuitry. As shown for IC 400, there are plurality of DENMOS-SCRs 100 integrated on the same substrate included to protect a plurality of terminals of the IC 400. Each of the DENMOS-SCRs 100 includes a gate terminal, an anode terminal and a cathode terminal, as marked on a single instance. The "T" shown for each of the of DENMOS-SCR 100 indicated at the top of the respective SCRs represents an input provided by a suitable trigger circuit to the gate.

IC 400 includes functional circuitry 424, which is integrated circuitry that realizes and carries out desired functionality of IC 400, such as that of a digital IC (e.g., digital signal processor) or analog IC (e.g., amplifier or power converter), such as a BiMOS IC. The capability of functional circuitry provided by IC 400 may vary, for example ranging from a simple device to a complex device. The specific functionality contained within functional circuitry 524 is not material to disclosed embodiments.

IC 400 also includes a number of external terminals, by way of which functional circuitry 424 carries out its function. It is to be understood that the number of terminals and their function can also vary widely. In the example of IC 400, two terminals shown operate as common input and output terminals (I/O), by way of which functional circuitry 424 can receive incoming signals and can generate outputs, as well known in the art. A dedicated input terminal IN is also shown in FIG. 4 for IC 400, as is a dedicated output terminal OUT. Each of terminals IN, OUT are also connected to functional circuitry 424. Power supply terminal Vdd receives a positive power supply voltage in this example, while ground terminal Vss is provided to receive a reference voltage, such as system ground.

The DENMOS-SCR 100 and/or the junction SCR 300 may be employed in the IC 400 to protect various nodes from over-voltage or under-voltage conditions resulting from different levels of ESD strike (Human Body Model (HBM), Charged Device Model (CDM), IEC, etc.). In a first example, instances of the DENMOS-SCR 100 (four shown) is configured as three-terminal devices. In this case the anode may be connected to the protected node, the cathode may be grounded, and the gate may be independently controlled by an external circuit.

In a second example, an instance of the DENMOS-SCR 100 is configured as a two-terminal device. This example is denoted DENMOS-SCR 100' in FIG. 4. In this case the protected node is connected to the anode of the DENMOS-SCR 100', and the cathode is grounded. In a third example, the junction SCR 300 is used to protect a circuit node of the IC 400. In this example the anode of the junction SCR 300 is connected to the protected node, and the cathode is grounded. In any of these examples, the anode and cathode connections may be reversed depending on whether over-voltage protection or under-voltage protection is desired. In some cases, multiple instances of the DENMOS-SCR 100 and/or the junction SCR 300 may be connected to a circuit node to provide protection against both over-voltage and under-voltage conditions.

However, in some applications, some circuit nodes of the IC 400 may be self-protecting, such as diode protected power supply pins. Although not shown, the ground shown connected to the DENMOS-SCRs 100 may be connected to VSS, such as resistively connected or shorted together. IC 400 includes an instance of the DENMOS-SCR 100 connected to each of its terminals.

EXAMPLES

Disclosed aspects are further illustrated by the following specific Examples, which should not be construed as limiting the scope or content of this Disclosure in any way.

Figure 5A:
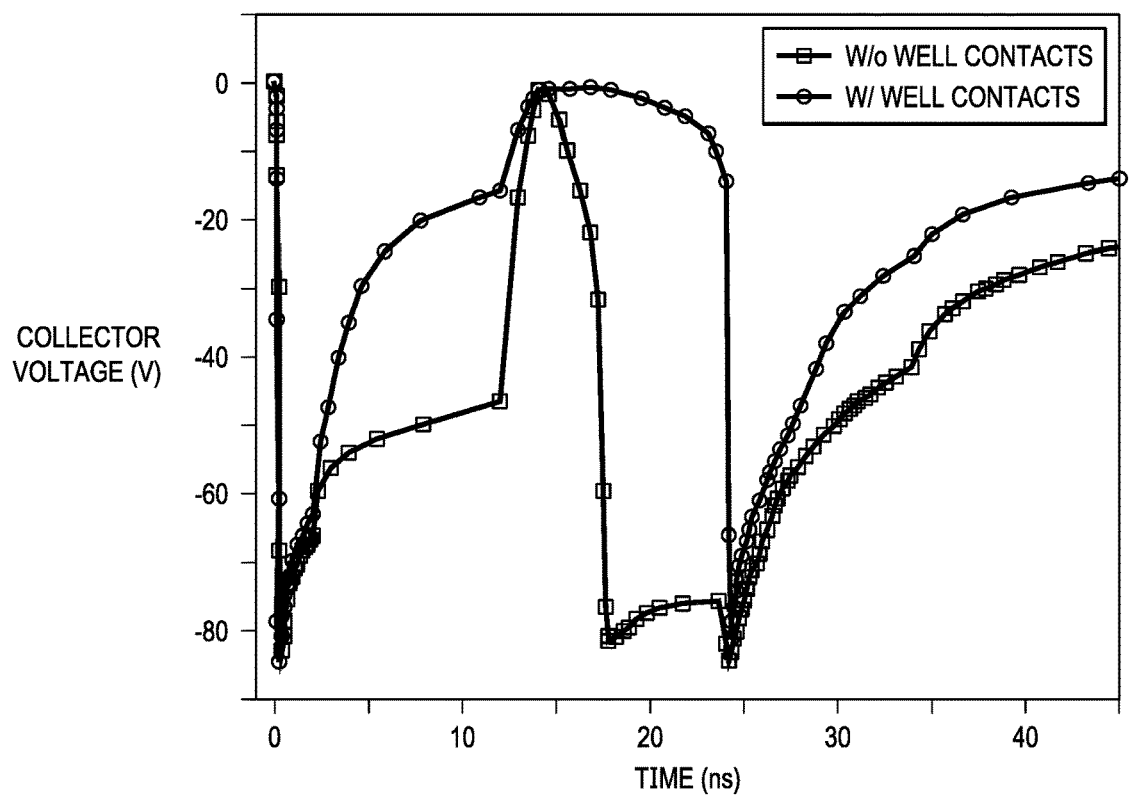
FIGS. 5A and 5B show results from 3D Technology Computer-Aided Design (TCAD) simulations performed. A double-pulse stimulus was used to replicate IEC-through-choke stress applied to the triggering node of a disclosed DENMOS-SCR based on the design shown in FIG. 1A.
Figure 5B:
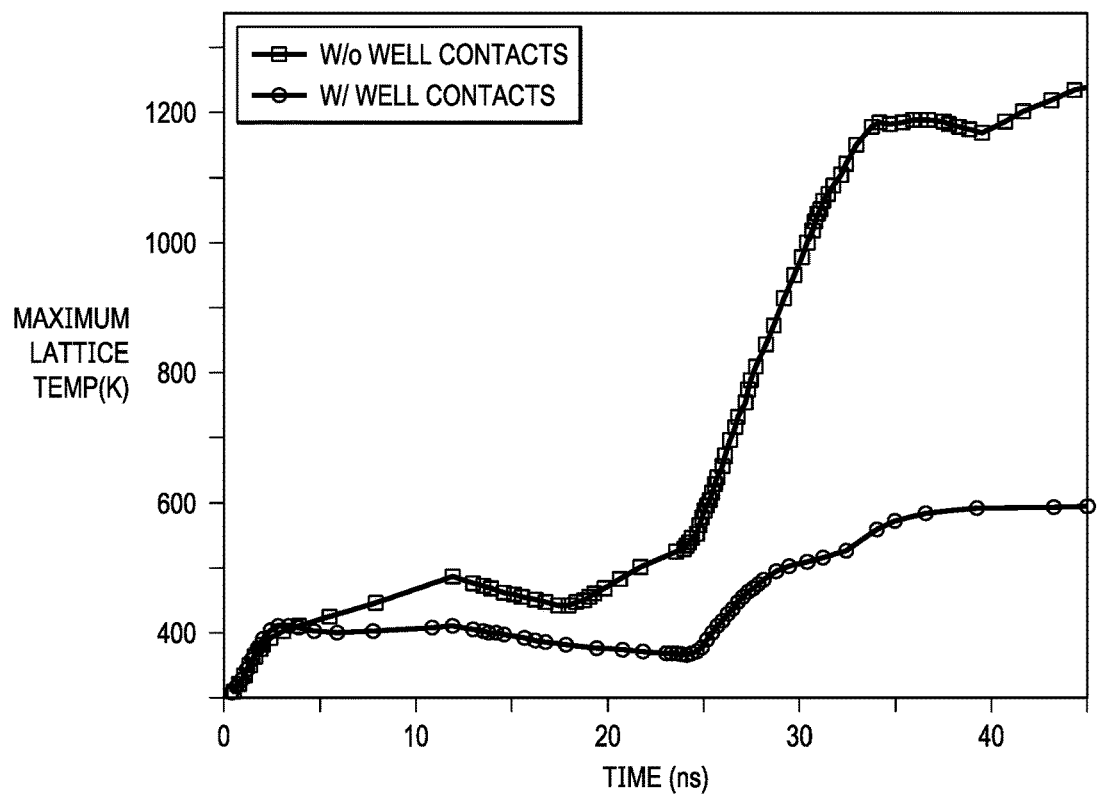

FIGS. 5A and 5B show results from 3D Technology Computer-Aided Design (TCAD) Simulations performed. A double-pulse stimulus being a transmission line pulse (TLP)-like stimulus with two pulses separated in time by 10 ns of a low-current "dead time" region. The first pulse has rise and fall times of 2 ns, a duration of 10 ns, and an amplitude of I1. The low-current "dead time" region has amplitude of I2. The second pulse has rise-time of 10 ns, varying duration of approximately 50 ns, and amplitude of I3. I3 is greater than I1, and I1 is greater than I2. The TCAD simulation was used to replicate IEC-through-choke stress applied to the triggering node of a disclosed DENMOS-SCR 100 based on the design shown in FIG. 1A.

As shown in FIG. 5A a disclosed DENMOS-SCR with selective well contact placement shown as "w/well contacts" and 50% well contact coverage shows a deeper snapback behavior compared to a control DENMOS-SCR with only a single well contact for each of the wells shown as "W/o well contacts" during initial low-amplitude pulse. As shown in FIG. 5B the peak temperature reached during this double pulse stimulus was found to decrease by approximately 50% (from 1200 K to 600 K) for the disclosed DENMOS-SCR as compared to the control DENMOS-SCR.

Disclosed aspects can be used to form semiconductor die having at least one SCR that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure. For example, although the anode and cathode contact is generally included, it may be possible for a trigger circuit is used so that the nwell connects to the trigger circuit instead of the anode contact of the SCR.

The invention claimed is:

1. A method of fabricating an integrated circuit (IC), comprising:
    forming on a semiconductor surface layer of a substrate circuitry comprising a plurality of transistors configured together for realizing at least one circuit function including at least one lateral semiconductor controlled rectifier (SCR) including a pwell and an nwell, wherein the nwell and the pwell form a junction extending into the semiconductor surface layer and the forming of the SCR comprises:
        forming a plurality of p+ contact regions contacting the pwell and spaced apart from one another along a first direction parallel to the junction, and
        forming a plurality of n+ contact regions contacting the nwell and spaced apart from one another along a second direction parallel to the junction.

2. The method of claim 1, wherein the circuitry comprises a drain extended n-channel metal oxide semiconductor (DENMOS) transistor including a gate electrode, and wherein the SCR and the DENMOS transistor are formed concurrently using a same process sequence.

3. The method of claim 1, wherein the SCR is a junction SCR lacking a gate electrode.

4. The method of claim 1, wherein the p+ contact regions are spaced apart evenly along the first direction and the n+ contact regions are spaced apart evenly along the second direction.

5. The method of claim 1, wherein a first well-contact coverage ratio for the plurality of p+ contact regions and a second well-contact coverage ratio for the plurality of n+ contact regions is given by W/(W+S), where W is a width of the contact regions and S is a spacing between adjacent contact regions, both the first and the second well-contact coverage ratios being in a range from 25% to 75%.

6. The method of claim 1, further comprising forming an n+ region in the pwell and a p+ region in the nwell, and forming a first interconnect connection between the n+ region and the p+ contact regions to provide a cathode contact and a second interconnect connection between the p+ region and the n+ contact regions to provide an anode contact.

7. The method of claim 6, wherein the forming of the first connection and the second connection both comprise forming a metal layer.

8. The method of claim 6, further comprising forming a first dielectric isolation between the p+ contact regions and the n+ region and a second dielectric isolation between the n+ contact regions and the p+ region.

9. The method of claim 8, wherein the first and second dielectric isolations extends below the p+ contact regions and the n+ contact regions.

10. The method of claim 1, wherein the plurality of p+ contact regions includes a first p+ contact region intersecting a side of the pwell and a second p+ contact region intersecting an opposite side of the pwell, and the plurality of n+ contact regions includes a first n+ contact region intersecting a side of the nwell and a second n+ contact region intersecting an opposite side of the nwell.

11. An integrated circuit (IC) comprising:
    a substrate having a semiconductor surface including circuitry comprising a plurality of transistors configured together for realizing at least one circuit function; and
    a lateral semiconductor controlled rectifier (SCR) extending into the semiconductor surface and having a p-n junction between a pwell and an nwell, the SCR including:
        a plurality of p+ contact regions spaced apart between a first side of the pwell and a second opposite side of the pwell in a first row that runs parallel to the p-n junction;
        an n+ region positioned inside the pwell;
        an anode contact including a conductive connection between the n+ region and the p+ contact regions;
        a plurality of n+ contact regions spaced apart between a first side of the nwell and a second opposite side of the nwell in a second row that runs parallel to the p-n junction, and
        a p+ region positioned inside the nwell; and
    a cathode contact including a conductive connection between the p+ region and the n+ contact regions;
    wherein the anode contact is connected to a first node in the circuitry, and wherein the cathode contact is connected to a second node in the circuitry.

12. The IC of claim 11, wherein the SCR comprises a gate electrode.

13. The IC of claim 11, wherein the SCR comprises a junction SCR lacking a gate electrode.

14. The IC of claim 11, wherein the p+ contact regions are positioned at uniform intervals in the first row and the n+ contact regions are positioned at uniform intervals in the second row.

15. The IC of claim 11, wherein a well-contact coverage ratio for the plurality of p+ contact regions and for the plurality of n+ contact regions is given by W/(W+S), where W is a width of the n+ contact regions and the p+ contact regions and S is the spacing between adjacent ones of the n+ contact regions and between adjacent ones of the p+ contact regions, both being in a range from 25% to 75%.

16. The IC of claim 11, further comprising dielectric isolation between the p+ contact regions and the n+ pwell contact and between the n+ contact regions and the p+ nwell contact.

17. The IC of claim 11, wherein the plurality of p+ contact regions includes a first p+ contact region that intersects the first side of the pwell and a second p+ contact region that intersects the second side of the pwell, and the plurality of n+ contact regions includes a first n+ contact region that intersects the first side of the nwell and a second n+ contact region that intersects the second side of the nwell.

18. A method of fabricating an integrated circuit (IC), comprising:
    forming a p-type well region extending into a semiconductor substrate;
    forming an n-type well region extending into the semiconductor substrate and forming a junction with the p-type well region;
    forming p-type well contacts extending into the p-type well region and spaced apart in a first row parallel to the junction; and
    forming n-type well contacts extending into the n-type well region and spaced apart in a second row parallel to the junction.

19. The method of claim 18, wherein the p-type well contacts include a first a p-type well contact abutting a first side of the p-type well and a second a p-type well contact abutting an opposite second side of the p-type well.

20. The method of claim 19, wherein the n-type well contacts include a first a n-type well contact abutting a first side of the n-type well and a second a n-type well contact abutting an opposite second side of the n-type well.

21. The method of claim 18, wherein the p-type well contacts and n-type well contacts have a width W parallel to the junction and a spacing S between nearest neighbor p-type well contacts, and a ratio of W to W+S is in a range from 0.25 to 0.75.

22. The method of claim 18, further comprising forming an n+ region extending into the p-type well region between the p-type well contacts and the junction, and forming a p+ region extending into the n-type well region between the n-type well contacts and the junction, the n+ region extending a first side of the p-type well region to an opposite second side of the p-type well region, and the p+ region extending a first side of the n-type well region to an opposite second side of the n-type well region.

* * * * *